(12) United States Patent
Kobayashi

(10) Patent No.: US 12,259,419 B2
(45) Date of Patent: Mar. 25, 2025

(54) TEST DEVICE AND PROBE POLISHING METHOD

(71) Applicant: TOKYO ELECTRON LIMITED, Tokyo (JP)

(72) Inventor: Masahito Kobayashi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 697 days.

(21) Appl. No.: 17/506,372

(22) Filed: Oct. 20, 2021

(65) Prior Publication Data
US 2022/0128603 A1    Apr. 28, 2022

(30) Foreign Application Priority Data
Oct. 23, 2020 (JP) .................... 2020-177874

(51) Int. Cl.
*G01R 3/00* (2006.01)
*B24B 19/16* (2006.01)
*G01R 1/073* (2006.01)

(52) U.S. Cl.
CPC ............ *G01R 3/00* (2013.01); *B24B 19/16* (2013.01); *G01R 1/07342* (2013.01)

(58) Field of Classification Search
CPC ......... B24B 19/16; G01R 1/073; G01R 3/00; G01R 1/06738; G01R 1/0675; G01R 1/07342; G01R 31/2867; G01R 31/2891; G01R 31/2893; G01R 31/2886
USPC .................................................. 324/754.11
See application file for complete search history.

(56) References Cited

FOREIGN PATENT DOCUMENTS

| JP | H10-092885 A | 4/1998 |
|---|---|---|
| JP | H11-054574 A | 2/1999 |
| JP | 2000-164649 A | 6/2000 |
| JP | 2004-288928 A | 10/2004 |
| JP | 2007-155369 A | 6/2007 |
| JP | 2007227840 A * | 9/2007 |
| JP | 2015-138888 A | 7/2015 |
| KR | 10-2017-0053775 A | 5/2017 |

OTHER PUBLICATIONS

Espacenet search JP2007227840A Cleaning Device for Probe Needle (Year: 2007).*

* cited by examiner

*Primary Examiner* — Alesa Allgood
*Assistant Examiner* — Courtney G McDonnough
(74) *Attorney, Agent, or Firm* — Fenwick & West LLP (57) ABSTRACT

A test device for testing a substrate is provided. The device comprises: a mounting table for test on which the substrate under test is mounted; a transportation mechanism to transport the substrate under test; a mounting table for polishing on which a polishing substrate is mounted; a first forward or backward movement mechanism to move the mounting table for test with respect to a probe; and a second forward or backward movement mechanism to move the mounting table for polishing with respect to the probe, wherein the mounting table for polishing is provided separately from the mounting table for test, a retreat region of the mounting table for test is opposite to a retreat region of the mounting table for polishing, and the second forward or backward movement mechanism is configured such that a portion of the polishing substrate overlaps the probe while the other portion of the polishing substrate does not overlap the probe.

5 Claims, 5 Drawing Sheets

TEST DEVICE AND PROBE POLISHING METHOD

CROSS-REFERENCE TO RELATED APPLICATIONS

This application claims priority to and the benefit of Japanese Patent Application No. 2020-177874 filed on Oct. 23, 2020, the disclosure of which is incorporated herein by reference in its entirety.

TECHNICAL FIELD

The present disclosure relates to a test device and a probe polishing method.

BACKGROUND

Japanese Patent Application Publication No. 2015-138888 discloses a prober including a stage on which a substrate is mounted and a probe card facing the stage, wherein the probe card includes a plurality of probe needles protruding toward the mounted substrate. The prober includes a needle tip polishing device configured to polish needle tips of the plurality of probe needles, and the needle tip polishing device includes a needle tip contact portion coming into contact with the needle tips and a support portion configured to support the needle tip contact portion. Here, a needle tip polishing surface configured to polish the needle tips is provided at a part of the needle tip contact portion which comes into contact with the needle tips.

SUMMARY

The present invention is directed to providing a technique for polishing a probe using a polishing substrate configured to suppress device enlargement without degrading a throughput and to be transportable by a transportation mechanism for transporting a substrate under test.

To this end, a test device configured to test a substrate under test is provided. The test device comprises: a mounting table for test on which the substrate under test is mounted; a transportation mechanism configured to transport at least the substrate under test; a mounting table for polishing on which a polishing substrate, the polishing substrate being a member configured to polish a probe coming into contact with a substrate during its test and has a shape and size transportable by the transportation mechanism, is mounted; a first forward or backward movement mechanism configured to move the mounting table for test forward or backward with respect to the probe; and a second forward or backward movement mechanism configured to move the mounting table for polishing forward or backward with respect to the probe, wherein the mounting table for polishing is provided separately from the mounting table for test, wherein a retreat region of the mounting table for test is at a position opposite to a retreat region of the mounting table for polishing, with the probe interposed therebetween in a plan view, and wherein the second forward or backward movement mechanism is configured such that a portion of the polishing substrate, mounted on the mounting table for polishing, on an opposite side to a retreat region of the polishing substrate, overlaps the probe in a plan view while a portion of the polishing substrate on a side of the retreat region of the polishing substrate does not overlap the probe in a plan view.

DETAILED DESCRIPTION

In a process of manufacturing a semiconductor device (hereinafter, referred to as a device), a plurality of devices are simultaneously formed on a substrate such as a semiconductor wafer (hereinafter, referred to as a wafer). The formed devices are tested with respect to their electrical properties and are classified into normal products and defective products. A test of a device is executed using, for example, a test device in a state before the substrate is divided into respective devices.

In a test device referred to as a prober, a mounting table configured to mount a substrate, on which a semiconductor device is formed, thereon or a transportation mechanism configured to transport a substrate is provided, and a probe card including a plurality of probes is mounted. In a test, the test device allows an electrode pad or a solder bump of the semiconductor device and the probe to be position-matched and come into contact with each other by relatively moving the mounting table and the probe card. In a contact state as described above, an electrical signal is supplied from a tester to the semiconductor device via the probe. Also, whether the semiconductor device is defective or not is determined on the basis of the electrical signal received by the tester from the semiconductor device via the probe.

When the above-described test is repeatedly performed, oxide on a surface of the electrode pad is attached to the needle tip of the probe or the needle tip of the probe is abraded, and, thus, polishing of the needle tip needs to be performed (refer to Japanese Patent Application Publication No. 2015-138888).

However, the test device of Japanese Patent Application Publication No. 2015-138888 does not include a mechanism configured to transport a needle tip contact portion on which a needle tip polishing surface is provided and which is supported by a support portion, and, thus, the test device has room for improvements in automatic exchange of the needle tip contact portion. Also, if a mechanism configured to transport the needle tip contact portion is additionally provided, automatic exchange is possible, but the test device becomes enlarged.

Further, it is considered that a shape and size of a needle tip polishing member is formed according to a shape and size transportable by the transportation mechanism for transporting a substrate under test, specifically, a shape and size equal to those of the substrate under test, so that the needle tip polishing member, that is, a polishing substrate is mounted on the mounting table instead of the substrate under test so as to be used for polishing the needle tips of the probe. In this configuration, although the needle tip polishing member is automatically exchangeable, it is necessary to remove the substrate under test from the mounting table in order to carry out the polishing, and, therefore, a throughput of the test is degraded.

To avoid the degrading of the throughput of the test, it is considered that a mounting table, on which the polishing substrate is mounted, is provided in addition to the mounting table on which the substrate under test is mounted. However, in this configuration, a space for retreating the substrate under test and the mounting table is necessary when carrying out the polishing by using the polishing substrate, and, thus, a footprint of the test device increases as much as the space required by additionally providing the mounting table on which the polishing substrate is mounted.

Accordingly, a technique according to the present disclosure polishes the probe using the polishing substrate transportable by the transportation mechanism for transporting the substrate under test, while suppressing device enlargement without degrading a throughput.

Hereinafter, a test device and a method of polishing a probe according to the embodiment will be described with reference to the drawings. Also, throughout the specification and drawings, elements having substantially like functions will be referred to as like reference numerals and a redundant description will be omitted.

Figure 1:
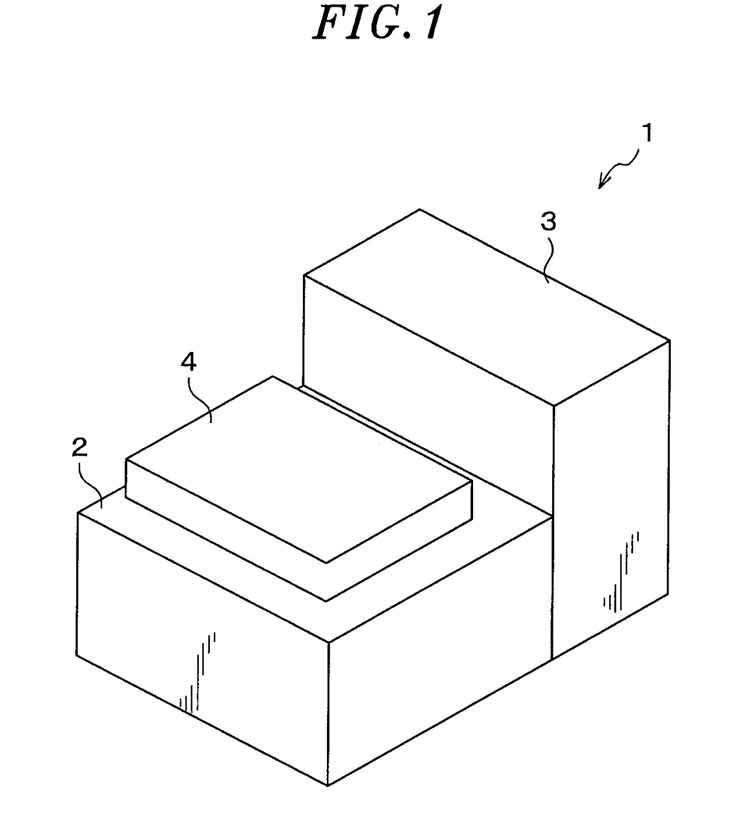
FIG. 1 is a schematic perspective view illustrating components of a test device according to an embodiment.
Figure 2:
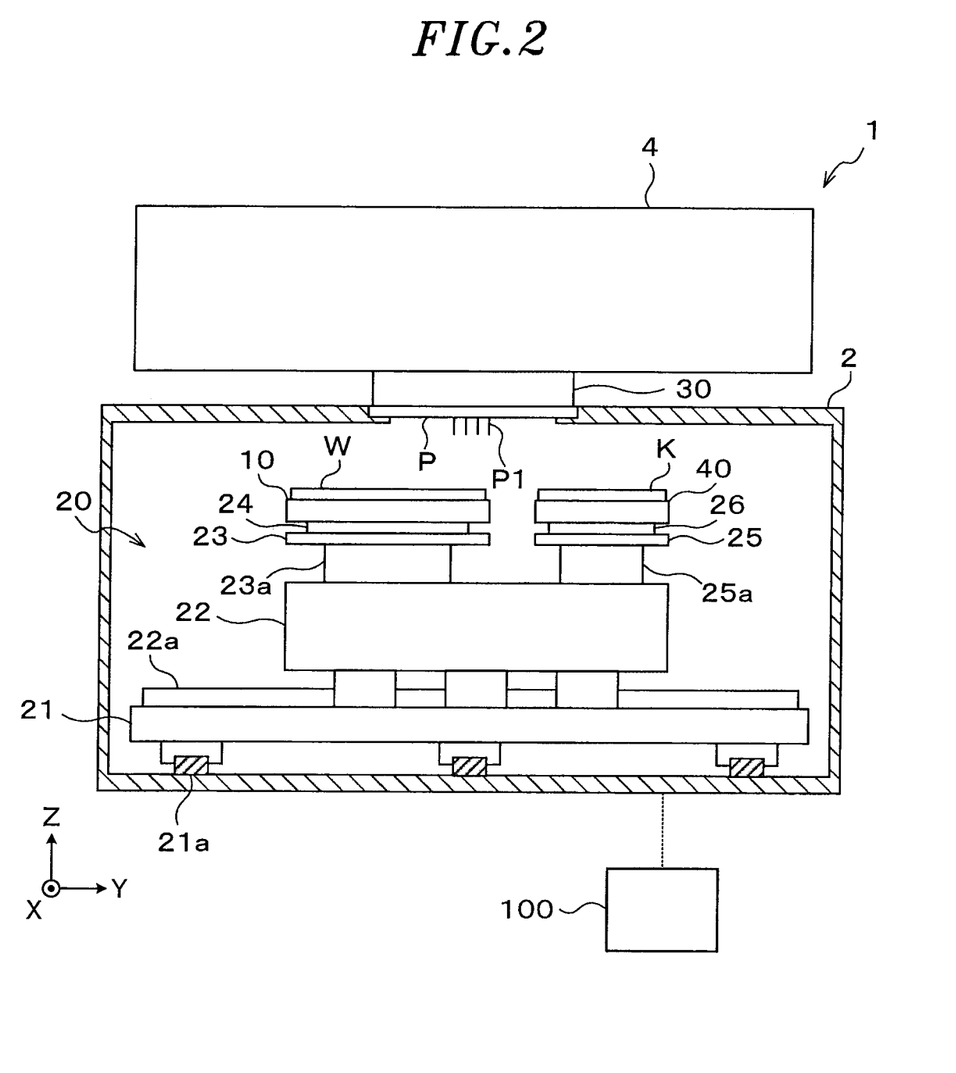
FIG. 2 is a schematic longitudinal cross-sectional view illustrating the components of the test device according to the embodiment.
Figure 3:
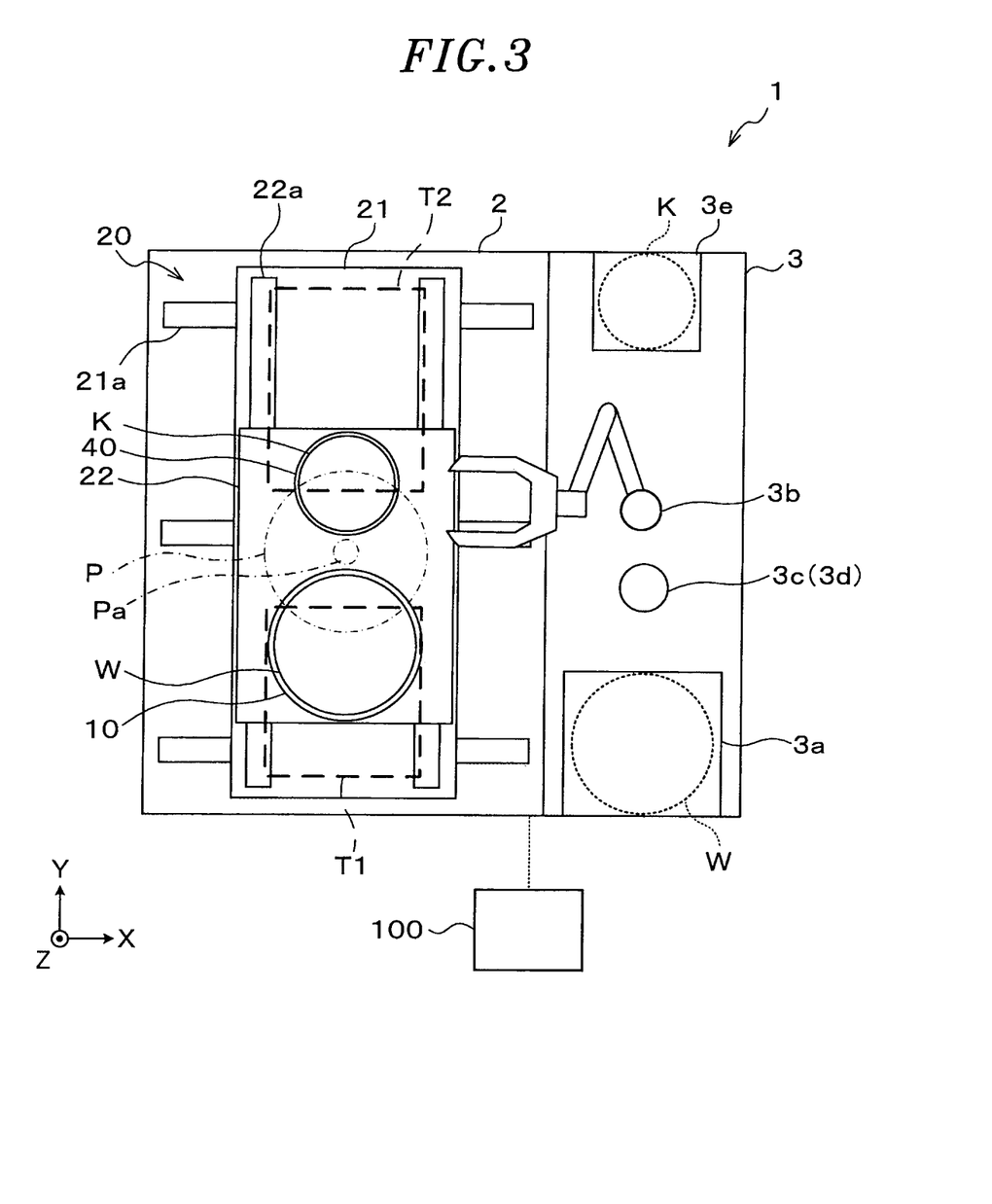
FIG. 3 is a plan view illustrating an element in which an accommodation chamber and a loader are built.
Figure 4:
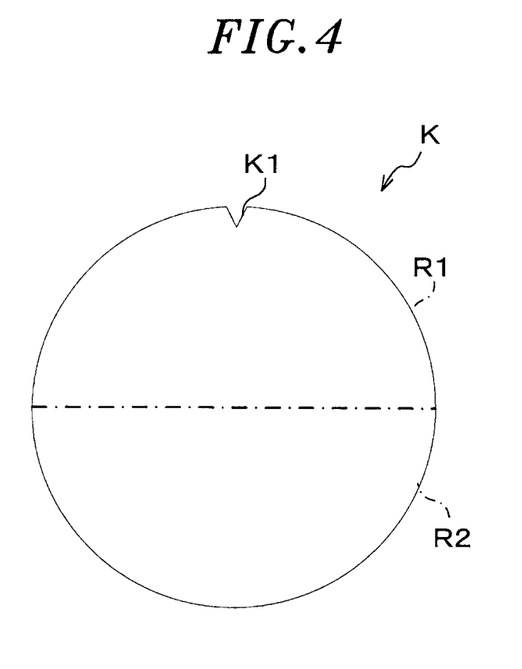
FIG. 4 is a plan view illustrating a polishing wafer.
Figure 5:
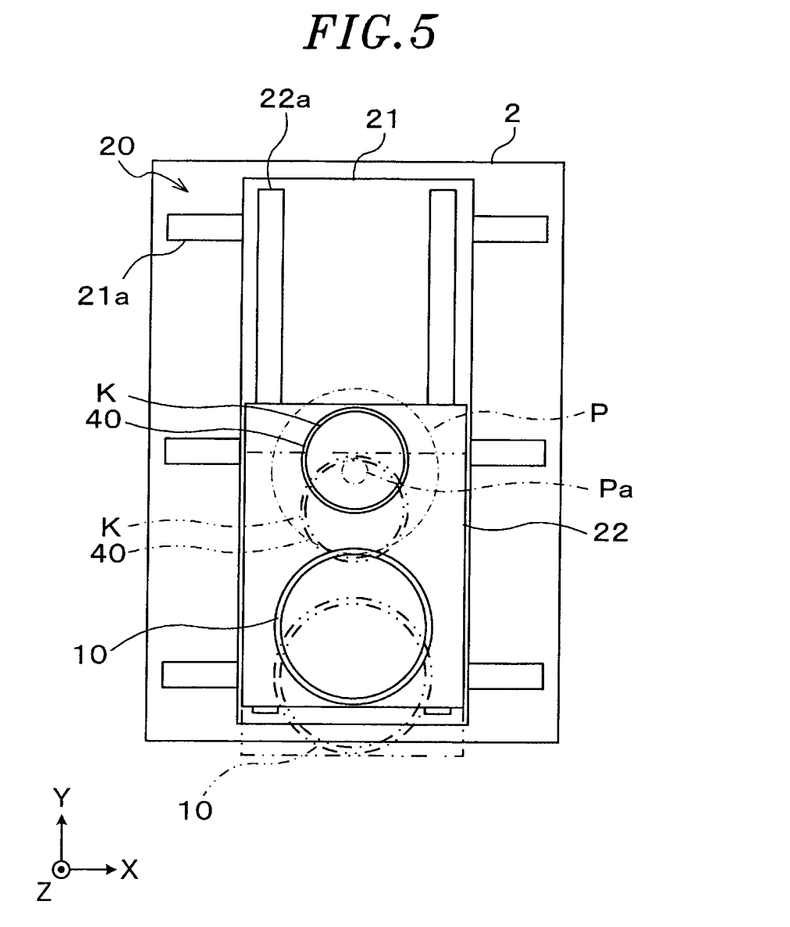
FIG. 5 is a view illustrating a movement mechanism.

First, components of the test device according to the embodiment will be described. FIGS. 1 and 2 are a perspective view and a longitudinal cross-sectional view schematically illustrating components of a test device 1 according to the embodiment, respectively. FIG. 3 is a plan view illustrating an element in which an accommodation chamber and a loader which will be described below are built. FIG. 4 is a plan view illustrating a polishing wafer which will be described below. FIG. 5 is a view illustrating a movement mechanism which will be described below.

The test device 1 is configured to test a wafer W under test as a substrate under test and, specifically, performs a test on electrical properties of a device (not shown) formed on the wafer W under test. On the wafer W under test, n (here, n is a natural number greater than or equal to two) number, that is, a plurality, of devices are formed. The test device 1 tests m (here, m is a natural number less than n) number of devices at the same time in one test. Also, the wafer W under test is formed to have, for example, a disc shape having a diameter of 300 mm.

As shown in FIGS. 1 and 2, the test device 1 includes an accommodation chamber 2 in which the wafer W under test is accommodated while being tested, a loader 3 disposed to be adjacent to the accommodation chamber 2, and a tester 4 disposed to cover a top of the accommodation chamber 2.

As shown in FIG. 2, the accommodation chamber 2 is a hollow housing and has a mounting table for test 10 on which the wafer W under test is mounted therein. The mounting table for test 10 suctions and retains the wafer W under test so as to maintain the position of the wafer W under test to be aligned with respect to the mounting table for test 10. Further, the mounting table for test 10 includes a temperature adjustment mechanism configured to adjust the temperature of the wafer W under test which is mounted on the mounting table for test 10. The temperature adjustment mechanism includes at least one of a heating mechanism (for example, a resistive heater) configured to heat the wafer W under test which is mounted on the mounting table for test 10 by heating the mounting table for test 10 and a cooling mechanism (for example, a flow channel through which a cooling refrigerant flows) configured to cool the wafer W under test which is mounted on the mounting table for test 10 by cooling the mounting table for test 10.

In addition, a movement mechanism 20 is provided in the accommodation chamber 2. The movement mechanism 20 may move the mounting table for test 10 and, specifically, may move the mounting table for test 10 in a horizontal direction and a vertical direction. Using the movement mechanism 20, relative positions of a probe card P which will be described below and the wafer W under test are adjusted so as to allow an electrode on a surface of the wafer W under test to come into contact with a probe P1 of the probe card P. Moreover, using the movement mechanism 20, the mounting table for test 10 may be moved forward or backward with respect to the probe P1 which will be described below. Accordingly, when the probe P1 is polished by a polishing wafer K which will be described below, the mounting table for test 10 and the wafer W under test which is mounted thereon may be retreated to a retreat region T1 (refer to FIG. 3) spaced apart from the probe P1 in a plan view.

For example, the movement mechanism 20 includes an X stage 21 and a Y stage 22 sequentially from below.

The X stage 21 is configured to be movable along a guide rail 21a provided on a bottom wall of the accommodation chamber 2 and elongating in an X direction (the width direction of the device) in the drawing. The Y stage 22 is configured to be movable along a guide rail 22a provided on the X stage 21 and elongating in a Y direction (the depth direction of the device) in the drawing.

The X stage 21 or the Y stage 22 includes, for example, a ball screw (not shown). A position of the X stage 21 in the X direction or a position of the Y stage 22 in the Y direction may be adjusted by adjusting a rotational amount of the ball screw using a motor (not shown) assembled with an encoder.

Also, the movement mechanism 20 includes a Z stage 23 on, for example, the Y stage 22.

The Z stage 23 is provided on the Y stage 22 with an extensible shaft 23a interposed therebetween, the extensible shaft 23a configured to be extensible in a Z direction (vertical direction) in the drawing, so that the Z stage 23 is liftable. For example, a motor assembled with an encoder is provided with respect to the extensible shaft 23a, such that the length of the extensible shaft 23a may be adjusted by adjusting a rotational amount of the motor, so as to adjust the position of the Z stage 23 in the Z direction.

On the Z stage 23, the mounting table for test 10 is supported through a rotating mechanism 24. The rotating mechanism 24 is a mechanism configured to rotate the mounting table for test 10 around a vertical axis and may adjust the direction of the wafer W under test which is mounted on the mounting table for test 10 by, for example, including a motor assembled with an encoder and adjusting the rotational amount of the motor.

The mounting table for test 10 may be moved in the X direction, Y direction, and Z direction using the X stage 21, Y stage 22, and Z stage 23. Further, the direction of the wafer W under test which is mounted on the mounting table for test 10 may be adjusted as described above using the rotating mechanism 24.

In the accommodation chamber 2, the probe card P is disposed above the mounting table for test 10. The probe card P includes the probe P1 which comes into electrical contact with an electrode of a device formed on the wafer W under test when electrical properties of the device are tested. The probe P1 is provided in a probe placement area Pa (refer to FIG. 3) in a central portion of the probe card P in a plan view.

Furthermore, the probe card P is connected to the tester 4 via an interface 30. When electrical properties are tested, each probe P1 comes into contact with an electrode of each device formed on the wafer W under test, supplies power from the tester 4 to the device through the interface 30, and transmits a signal from the device to the tester 4 through the interface 30.

As shown in FIG. 3, the loader 3 includes an accommodation unit 3a which accommodates a plurality of wafers W under test, a transportation mechanism 3b configured to transport the wafer W under test, and a pre-alignment mechanism 3c configured to adjust the direction of the wafer W under test.

Specifically, the accommodation unit 3a accommodates a front opening unified pod (FOUP) (not shown) which is a transportation container configured to accommodate the plurality of wafers W under test. The accommodation unit 3a is provided on a front side (the negative side in the Y direction in the drawing) where a worker can easily work.

The transportation mechanism 3b takes the wafer W under test out of the FOUP in the accommodation unit 3a and loads it into the accommodation chamber 2. Also, the transportation mechanism 3b takes the wafer W under test, in which electrical properties of the device are completed, out of the accommodation chamber 2 and returns it to the FOUP in the accommodation unit 3a.

The pre-alignment mechanism 3c includes a rotational mounting table 3d configured to rotate the wafer W under test around the vertical axis, a light emitting and receiving unit (not shown) configured to detect a notch of the wafer W under test, or the like.

The tester 4 includes a test board (not shown) reproducing a part of circuit configuration of a motherboard on which a device is mounted. The test board is connected to a test computer (not shown) configured to determine whether the device is normal or defective on the basis of the signal from the device formed on the wafer W under test. In the tester 4, circuit configurations of a plurality of types of motherboards may be reproduced by way of replacing the test board.

In the test device 1, when electrical properties of the device formed on the wafer W under test are tested, the test computer transmits data to the test board connected to the device through each probe P1. Then, the test computer determines whether the transmitted data is accurately processed by the test board on the basis of an electrical signal from the test board.

Further, in the accommodation chamber 2 of the test device 1, as shown in FIG. 2, a mounting table for polishing 40, on which the polishing wafer K used as a polishing substrate is mounted, is provided separately from the mounting table for test 10. The mounting table for polishing 40 suctions and retains the polishing wafer K so as to maintain the position of the polishing wafer K to be aligned with respect to the mounting table for polishing 40.

The polishing wafer K is a member configured to polish the probe P1 (specifically, a needle tip thereof) and has a size and shape transportable by the transportation mechanism 3b (refer to FIG. 3). Specifically, for example, as shown in FIG. 4, the polishing wafer K is a disc-shaped member like the wafer W under test, and has a diameter of about 150 mm to 300 mm. Also, in terms of the footprint of the test device 1, it is preferable that the diameter of the polishing wafer K is small. However, when the diameter is smaller than 150 mm, it is impossible to retain the polishing wafer K using a transportation arm of the existing transportation mechanism 3b. In addition, the polishing wafer K may be manufactured by, for example, attaching a polishing sheet (wrapping sheet) to a surface of a disc-shaped member.

The polishing wafer K may have a notch K1 like the wafer W under test. Also, in the following description, a region on a side of the notch K1, when the polishing wafer K is divided into two parts in a plan view, is referred to as a first region R1 and a region on the other side thereof is referred to as a second region R2.

By using the polishing wafer K as described above, the polishing wafer K may be automatically replaced by using the transportation mechanism 3b without involving a human worker.

Furthermore, in accordance with the shape of the polishing wafer K, the mounting table for polishing 40 is formed to have a cylindrical shape and has a diameter slightly greater than the diameter of the polishing wafer K in a plan view.

The movement mechanism 20 provided in the accommodation chamber 2 of FIG. 2 may move the mounting table for test 10 as well as the mounting table for polishing 40. Specifically, the movement mechanism 20 may move the mounting table for polishing 40 and the mounting table for test 10 together in a horizontal direction and may move the mounting table for polishing 40 in the vertical direction independently from the mounting table for test 10. By means of the movement mechanism 20, the probe P1 of the probe card P and the polishing wafer K mounted on the mounting table for polishing 40 may come into contact with each other. Also, since the mounting table for polishing 40 may be moved forward or backward with respect to the probe P1 by the movement mechanism 20, in a test on the wafer W under test which is mounted on the mounting table for test 10, the mounting table for polishing 40 and the polishing wafer K mounted thereon may be moved to a retreat region T2 (refer to FIG. 3) spaced apart from the probe P1 in a plan view.

That is, the movement mechanism 20 functions as a first forward or backward movement mechanism configured to move the mounting table for test 10 forward or backward with respect to the probe P1 and also as a second forward or backward movement mechanism configured to move the mounting table for polishing 40 forward or backward with respect to the probe P1.

The mounting table for polishing 40 is movable in the X direction and Y direction by the X stage 21 and Y stage 22 like the mounting table for test 10. That is, the mounting table for polishing 40 and the mounting table for test 10 share the movement mechanism in the X direction and the Y direction which are horizontal directions.

The movement mechanism 20 has a Z stage 25 above, for example, the Y stage 22 to allow the mounting table for polishing 40 to be movable in the Z direction.

The Z stage 25 is provided on the Y stage 22 with an extensible shaft 25a interposed therebetween, the extensible shaft 25a configured to be extensible in the Z direction (vertical direction) in the drawing, so that the Z stage 25 is liftable. For example, a motor assembled with an encoder is provided with respect to the extensible shaft 25a, so that the length of the extensible shaft 25a may be adjusted by adjusting a rotational amount of the motor, so as to adjust the position of the Z stage 25 in the Z direction.

On the Z stage 25, the mounting table for polishing 40 is supported through a rotating mechanism 26. The rotating mechanism 26 is a device configured to rotate the mounting table for polishing 40 around a vertical axis and may adjust the direction of the polishing wafer K which is mounted on the mounting table for polishing 40 by, for example, including a motor assembled with an encoder and adjusting a rotational amount of the motor.

Also, as shown in FIG. 3, in the test device 1, an accommodation unit 3e which accommodates a plurality of polishing wafers K is provided on the loader 3. The accommodation unit 3e is provided on an inner side of the loader 3 (the positive side in the Y direction in the drawing).

The polishing wafer K accommodated in the accommodation unit 3e is taken out and carried into the accommodation chamber 2 by the transportation mechanism 3b and is mounted on the mounting table for polishing 40.

When it is necessary to replace the polishing wafer K in the accommodation chamber 2, the polishing wafer K is taken out and returned to the accommodation unit 3e by the transportation mechanism 3b while, simultaneously, a new polishing wafer K in the accommodation unit 3e is carried into the accommodation chamber 2 by the transportation mechanism 3b.

The test device 1 further includes a controller 100. The controller 100 is configured, for example, by a computer, including a central processing unit (CPU), a memory, or the like, and includes a program housing portion (not shown). In the program housing portion, a program which controls a variety of processes in the test device 1 is housed. The program has been recorded in a non-transitory computer-readable storage medium and may be installed to the controller 100 from the storage medium. A part or the entirety of the program may be implemented as exclusive hardware (circuit substrate).

In the test device 1 configured as described above, as shown in FIG. 3, the retreat region T1 of the mounting table for test 10 by the movement mechanism 20 is located on a side opposite to the retreat region T2 of the polishing wafer K by the movement mechanism 20, with the probe placement area Pa interposed therebetween in a plan view. Also, in the test device 1, in the polishing wafer K mounted on the mounting table for polishing 40, a rear side portion thereof, which is on a side of the retreat region of the polishing wafer K, is not used for polishing of the probe P1, and only a front side portion thereof (the negative side in the Y direction in the drawing) on an opposite side is used for polishing of the probe P1. In other words, the movement mechanism 20 is configured to satisfy the following conditions.

(Conditions Satisfied by Movement Mechanism 20)

In the polishing wafer K mounted on the mounting table for polishing 40, a front side portion (the negative side in a Y direction of FIG. 5), as shown with a solid line in FIG. 5, may be overlapped with the probe placement area Pa (that is, the probe P1) in a plan view. However, a rear side portion (the positive side in the Y direction in FIG. 5) may not overlap the probe placement area Pa in a plan view as indicated by a double dot and dash line.

Specifically, to satisfy the above conditions, the movement mechanism 20 or the accommodation chamber 2 is structurally limited. For example, a length, a placement position, and the like of the guide rail 22a with respect to the Y stage 22 of the movement mechanism 20 are set to satisfy the above conditions.

Here, a comparative example, which is different from the embodiment, will be described below. The comparative example has a configuration in which the movement mechanism 20 is configured to also overlap the rear side portion (the positive side in the Y direction of FIG. 5) of the polishing wafer K mounted on the mounting table for polishing 40 with the probe placement area Pa in a plan view as indicated by a double dot and dash line.

In the embodiment, in comparison to the comparative example, the distance in which the mounting table for polishing 40 moves toward the front side (the negative side in the Y direction in FIG. 5) during the polishing is short, and, thus, the distance from the mounting table for test 10 located in the retreat region T1 to the probe P1 during the polishing in a plan view may be decreased. Accordingly, in the embodiment, it is possible to decrease the retreat region T1 of the mounting table for test 10, that is, a movement range of the mounting table for test 10 may be decreased. Accordingly, in the embodiment, enlargement of the test device 1 may be suppressed. In the comparative example, however, it can be clearly seen, from a state indicated by a double dot and dash line in FIG. 5, in which the mounting table for test 10 and the like are not present in the accommodation chamber 2, that the device is enlarged.

Also, even when only a front side portion (the negative side in the Y direction in FIG. 5 or the like) of the polishing wafer K mounted on the mounting table for polishing 40 is used for polishing of the probe P1 as in the embodiment, an entire surface of the polishing wafer K may be provided for polishing without waste when performed as follows.

If the direction of the polishing wafer K mounted on the mounting table for polishing 40 is adjusted by rotating the mounting table for polishing 40 using the rotating mechanism 26, the entire surface of the polishing wafer K may be provided for polishing without waste in the embodiment as well. Specifically, after the entire surface of the first region R1 of the polishing wafer K, which was on the front side (the negative side in the Y direction in FIG. 5 or the like) is used for polishing, the polishing wafer K is rotated by 180° by rotating the mounting table for polishing 40, so that the second region R2 of the polishing wafer K, which was unused, may be provided on the front side (the negative side in the Y direction of FIG. 5 or the like) so as to be used for the polishing.

Subsequently, an example of the test process by using the test device 1 will be described.

In the test, the wafer W under test is retreated from the FOUP in the accommodation unit 3a of the loader 3 and carried into the accommodation chamber 2 by the transportation mechanism 3b. Also, the wafer W under test, which was retained by the transportation mechanism 3b, passes through a plurality of lifting pins (not shown) provided with respect to the mounting table for test 10 and is received by the mounting table for test 10. That is, the wafer W under test is mounted on the mounting table for test 10.

Subsequently, precise positions of the mounting table for test 10 and the probe P1 are checked by a camera (not shown). Thereafter, the mounting table for test 10 is moved by the movement mechanism 20, and the probe P1 provided above the mounting table for test 10 comes into contact with the electrode of the device, which is under test, on the wafer W under test.

Then, a test signal is input to the probe P1. Accordingly, testing of electrical properties of the device under test is started. When testing of electrical properties is finished, the mounting table for test 10 is moved and testing of electrical properties with respect to a next device, which is under test, of the wafer W under test is performed.

Subsequently, until testing of electrical properties of all devices formed on the wafer W under test is completed, following processes after a process of mounting the wafer W under test are repeatedly performed. When the processes are completed, in a reverse order of carrying-in, the wafer W under test is retreated from the accommodation chamber 2 and returned to the FOUP in the accommodation unit 3a of the loader 3.

Consecutively, an example of polishing of the probe P1 using the test device 1 will be described.

(Mounting)

First, the polishing wafer K is mounted on the mounting table for polishing 40. Specifically, the polishing wafer K is taken out of the accommodation unit 3e of the loader 3 and carried into the accommodation chamber 2 by the transportation mechanism 3b. Also, the polishing wafer K, which was retained by the transportation mechanism 3b, passes through a plurality of lifting pins (not shown) provided with respect to the mounting table for polishing 40 and is received by the mounting table for polishing 40.

(Testing and Retreating of Mounting Table for Polishing 40)

Thereafter, the above testing is performed. Here, the mounting table for polishing 40 is moved to the retreat region T2 by the movement mechanism 20 and retreated from the probe P1.

(Polishing)

For example, during the above testing, when an error occurs in the probe P1, such as absence of electrical connection between the probe P1 and the electrode on the wafer W under test, the testing of electrical properties of the device is stopped and the polishing of the probe P1 is performed as follows. That is, the mounting table for test 10 is moved by the movement mechanism 20 and retreated from the probe P1 while, simultaneously, the mounting table for polishing 40 is moved by the movement mechanism 20 and the probe P1 is polished at a desired part of the front side portion (the negative side in the Y direction in FIG. 5 or the like) of the polishing wafer K mounted on the mounting table for polishing 40. Polishing of the probe P1 using the polishing wafer K is performed by overdriving the mounting table for polishing 40, that is, by lifting the mounting table for polishing 40 by a certain distance from a position where the polishing wafer K and the probe P1 come into contact with each other. Also, before the polishing of the probe P1, the accurate position of the probe P1 is checked by the camera (not shown). The accurate position of the mounting table for polishing 40 may also be checked by the camera (not shown). Information on which part of the polishing wafer K has been used is stored in a memory (not shown) of the controller 100.

In polishing, it is unnecessary to remove the wafer W under test from the mounting table for test 10.

Also, when polishing is completed, testing of electrical properties of a device, which has been stopped, is restarted.

(Determination of Whether Entire Surface of Front Side Portion was Used)

Subsequently, the controller 100 determines whether the entire surface of the region which is on the front side (the negative side in the Y direction in FIG. 5 or the like) of the polishing wafer K mounted on the mounting table for polishing 40 was used for polishing.

(Determination of Whether Rear Side Portion was Used)

Further, when it is determined that the entire surface of the region which is on the front side of the polishing wafer K mounted on the mounting table for polishing 40 was used for polishing, the controller 100 determines whether a region which is on the rear side (the positive side in the Y direction in FIG. 5 or the like) of the same wafer K was used for polishing.

(Rotation)

When the region which is on the rear side was not used for polishing, the mounting table for polishing 40 is rotated by the rotating mechanism 26, such that the direction of the polishing wafer K mounted on the mounting table for polishing 40 is adjusted. Specifically, for example, the polishing wafer k is rotated by 180°. Information on the rotating of the polishing wafer K is stored in the memory (of the controller 100 and is used for determination in the above-described process of determining whether the rear side portion was used.

(Replacement)

As a result of the process of determining whether the rear side portion was used, when it is determined that the region, which is on the rear side of the polishing wafer K mounted on the mounting table for polishing 40, was also used for polishing, replacement of the polishing wafer K is performed. Specifically, the polishing wafer K to be replaced is retreated from the accommodation chamber 2 and returned to the accommodation unit 3e of the loader 3 in a reverse order of carrying-in. Subsequently, a new polishing wafer K is retreated from the accommodation unit 3e of the loader 3 and mounted on the mounting table for polishing 40 in the accommodation chamber 2 by the transportation mechanism 3b. The replacement of the polishing wafer K is performed, for example, when replacement of the wafer W under test is performed.

In the above embodiment, the replacement of the polishing wafer K can be done by using the transportation mechanism 3b configured to transport the wafer W under test, and, therefore, the probe P1 is polished using the polishing wafer k which is automatically replaceable.

Also, in the embodiment, the mounting table for polishing 40, on which the polishing wafer k is mounted, is provided separately from the mounting table for test 10 on which the wafer W under test is mounted. Accordingly, it is unnecessary to remove the wafer W under test from the mounting table for test 10 to polish the probe P1 using the polishing wafer K, and, thus, there is no degrade in throughput of a test due to the automatic replacement of the polishing wafer K.

Also, in the embodiment, the movement mechanism 20 is configured such that the front side portion (the negative side in the Y direction of FIG. 5 or the like) of the polishing wafer K mounted on the mounting table for polishing 40 may overlap the probe P1 in a plan view while the rear side portion (the positive side in the Y direction of FIG. 5 or the like) may not overlap the probe P1 in a plan view. Accordingly, although the mounting table for polishing 40 is provided separately from the mounting table for test 10, an increase in footprint of the test device 1 may be suppressed.

Accordingly, according to the embodiment, the probe P1 may be polished by using the polishing wafer K configured to be transportable by the transportation mechanism 3b transporting the wafer W under test while suppressing enlargement of the device without degrading the throughput of test.

In addition, even with the configuration of the embodiment, the entire surface of the polishing wafer K may be effectively provided for polishing without waste by way of adjusting the direction of the polishing wafer K mounted on the mounting table for polishing 40 by rotating the mounting table for polishing 40 by means of the rotating mechanism 26.

Furthermore, instead of adjusting the direction of the polishing wafer K mounted on the mounting table for polishing 40 by rotating the mounting table for polishing 40 using the rotating mechanism 26, the following adjustment may be performed. That is, the direction of the polishing wafer K mounted on the mounting table for polishing 40 may be adjusted by using the pre-alignment device 3c as an adjustment mechanism. Specifically, after the entire surface of the first region R1 of the polishing wafer K, which is on the front side (the negative side in the Y direction of the drawing) was used for polishing, the polishing wafer K is transported to the pre-alignment device 3c from the mounting table for polishing 40 by using the transportation mechanism 3b. Then, the polishing wafer K is rotated by 180° using the pre-alignment device 3c, and, thereafter, the polishing wafer K is returned to the transportation mechanism 3b and the mounting table for polishing 40, so that the polishing wafer K is mounted on the mounting table for polishing 40 while the second region R2, which was unused, is on the front side. Accordingly, the entire surface of the polishing wafer K may be provided for polishing without waste.

Figure 6:
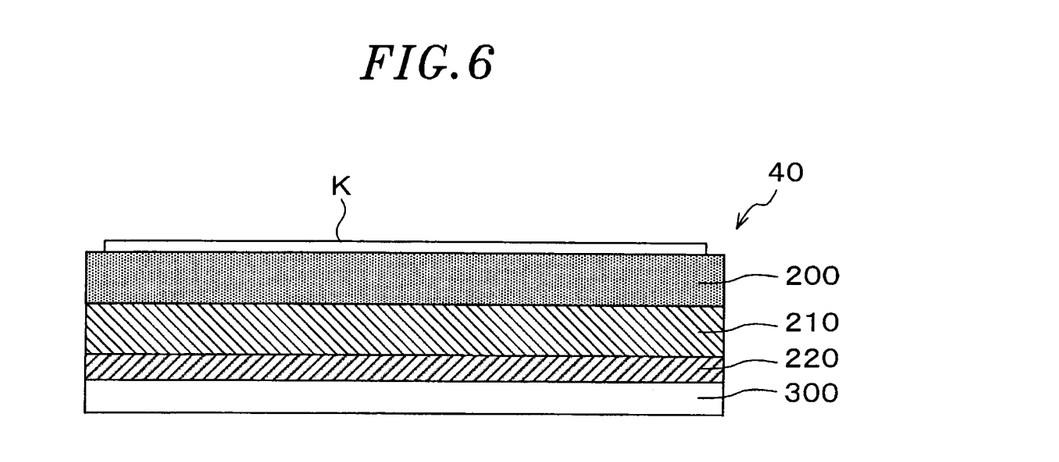
FIG. 6 is a cross-sectional view illustrating another example of a mounting table for polishing.

FIG. 6 is a cross-sectional view illustrating another example of the mounting table for polishing.

The mounting table for polishing 40 of FIG. 6 includes a top plate 200 and a cooling unit 210 and a heating unit 220 as a temperature adjustment mechanism. The mounting table for polishing 40 is mounted on the movement mechanism 20 (refer to FIG. 2 or the like) with a heat insulation member 300 interposed therebetween.

The top plate 200 is a member on which the polishing wafer K is mounted and has, for example, a disc shape. One or a plurality of temperature sensors (not shown) are provided on the top plate 200.

The cooling unit 210 is a member configured to cool the polishing wafer K mounted on the top plate 200 by cooling the top plate 200. The cooling unit 210 is provided between the top plate 200 and the heating unit 220.

Components of the cooling unit 210 are not particularly limited, and any components capable of cooling the top plate 200 may be included. As an example, a refrigerant flow channel (not shown) of the cooling unit 210 through which a refrigerant flows may be formed in the cooling unit 210.

The heating unit 220 is a member configured to heat the polishing wafer K mounted on the top plate 200 by heating the top plate 200. The heating unit 220 is disposed to face the top plate 200 with the cooling unit 210 interposed therebetween.

Components of the heating unit 220 are not particularly limited, and any components capable of heating the top plate 200 may be included. As an example, the heating unit 220 may include a resistive heater.

In the mounting table for polishing 40 of FIG. 6, the temperature of the polishing wafer K mounted on the mounting table for polishing 40 is adjusted by using the cooling unit 210 and the heating unit 220. Specifically, in the mounting table for polishing 40 of FIG. 6, the temperature of the polishing wafer K mounted on the mounting table for polishing 40 is adjusted, by using the cooling unit 210 and the heating unit 220, to a temperature, which is set in a test, of the wafer W under test which is mounted on the mounting table for test 10.

A reason for adjusting a temperature as described above is as follows.

The temperature of the wafer W under test which is set in the test may be higher or lower than a room temperature (for example, 25° C.).

When the temperature of the wafer W under test, which is set in the test, is a high temperature, the probe card P may be, for example, heated through the probe P1 by the high-temperature wafer W under test and a central portion thereof may be bent to protrude downward in the test. In this case, if the temperature of the mounting table for polishing 40 and the polishing wafer K mounted thereon is a room temperature, the probe card P, which is at a high temperature in the test or the like, is cooled through the probe P1 by the polishing wafer K which is at the room temperature while the probe P1 is polished by the polishing wafer K, such that the above bent state is released. As a result thereof, a contact pressure between the polishing wafer K and the probe P1 during the polishing gets lower than a desired value, and, thereby, the probe P1 is not appropriately polished, and in some cases, an electrical test cannot be appropriately performed using the probe P1 after polishing.

Also, when the temperature of the wafer W under test, which is set in the test, is a low temperature, the probe card P may be, for example, cooled through the probe P1 by the low-temperature wafer W under test, and the central portion thereof is bent to protrude upward in the test. In this case, if the mounting table for polishing 40 and the polishing wafer K mounted thereon are at a room temperature, the probe card P, which is low temperature in the test or the like, is heated through the probe P1 by the polishing wafer K which is room temperature while the probe P1 is polished by the polishing wafer K, so that a bent state is released. As a result thereof, a contact pressure between the polishing wafer K and the probe P1 during the polishing gets higher than a desired value, that is, the probe P1 is unnecessarily polished and, thereby, a life of the probe card P may be reduced.

In the mounting table for polishing 40 of FIG. 6, the temperature of the polishing wafer K mounted on the mounting table for polishing 40 is adjusted by the cooling unit 210 and the heating unit 220 as described above. Therefore, it is possible to minimize thermal variation of the probe card P, which is at a high temperature or low temperature during the test or the like, caused by the polishing wafer K. Accordingly, the probe P1 is appropriately polished, the life of the probe card P is not reduced, and an electrical test may be appropriately performed using the probe P1 after polishing.

In addition, any one of the cooling unit 210 and the heating unit 220 may be omitted. For example, when testing of electrical properties is only performed at a high temperature, the cooling unit 210 may be omitted.

It should be noted that the embodiment disclosed herein is exemplary in every aspect and is not limitative. The above embodiment may be omitted, substituted, and changed in a variety of forms without departing from the attached claims and a major point thereof

What is claimed is:

1. A test device configured to test a substrate under test, comprising:
    a mounting table for test on which the substrate under test is mounted;
    a transportation mechanism configured to transport at least the substrate under test;
    a mounting table for polishing on which a polishing substrate, the polishing substrate being a member configured to polish a probe coming into contact with a substrate during its test and has a shape and size transportable by the transportation mechanism, is mounted;
    a first forward or backward movement mechanism configured to move the mounting table for test forward or backward with respect to the probe;
    a second forward or backward movement mechanism configured to move the mounting table for polishing forward or backward with respect to the probe; and
    a rotating mechanism configured to rotate the mounting table for polishing,
    wherein the mounting table for polishing is provided separately from the mounting table for test,
    wherein a retreat region of the mounting table for test is at a position opposite to a retreat region of the mounting table for polishing, with the probe interposed therebetween in a plan view, and wherein the second forward or backward movement mechanism is configured such that a portion of the polishing substrate, mounted on the mounting table for polishing, on a front side, which is an opposite side to a retreat region of the polishing substrate, overlaps the probe in a plan view while a portion of the polishing substrate on an inner side, which is the retreat region of the polishing substrate, does not overlap the probe in a plan view, and wherein, by the rotating mechanism and the second forward or backward movement mechanism, a region of the polishing substrate mounted on the mounting table, that was the inner side and could not be overlapped with the probe in a plan view, is overlapped with the probe in a plan view as a region of the front side.

2. The test device according to claim 1, further comprising an adjustment mechanism configured to adjust a direction of the polishing substrate mounted on the mounting table for polishing.

3. The test device according to claim 1, wherein the mounting table for polishing comprises a temperature adjustment mechanism configured to adjust the temperature of the polishing substrate mounted on the mounting table for polishing.

4. The test device of claim 3, wherein the temperature adjustment mechanism adjusts the temperature of the polishing substrate mounted on the mounting table for polishing to be a temperature, which is set in a test, of the substrate under test which is mounted on the mounting table for test.

5. A method of polishing a probe coming into contact with a substrate under test, the method comprising:

mounting a polishing substrate, which is a member configured to polish the probe and has a shape and size transportable by a transportation mechanism configured to transport the substrate under test, on a mounting table for polishing provided separately from a mounting table for test on which the substrate under test is mounted;

retreating the mounting table for test from the probe by moving the mounting table for test to a retreat region of the mounting table for test, which is located on a side opposite to a retreat region of the mounting table for polishing, with the probe interposed therebetween; and at the same time, polishing the probe at a front side, which is a part opposite to an inner side that is a retreat position of the polishing substrate mounted on the mounting table for polishing, by moving the mounting table for polishing, the method further comprising adjusting a direction of the polishing substrate mounted on the mounting table for polishing by rotating the mounting table for polishing by a rotating mechanism configured to rotate the mounting table for polishing, wherein, by the rotating mechanism and by moving the mounting table for polishing, a region of the polishing substrate mounted on the mounting table, that was the inner side and could not be overlapped with the probe in a plan view, is overlapped with the probe in a plan view as a region of the front side or returning the polishing substrate to the mounting table for polishing after adjusting the direction of the polishing substrate that was mounted on the mounting table for polishing.

* * * * *